United States Patent [19]

Muller et al.

[11] 4,008,102

[45] Feb. 15, 1977

[54] METHOD OF THE MANUFACTURE OF A SUPERCONDUCTOR WITH A LAYER OF THE A-15 PHASE OF THE SYSTEM Nb-Al-Si

[75] Inventors: Alfred Muller; Arno Fink, both of Erlangen, Germany

[73] Assignee: Siemens Aktiengesellschaft, Munich, Germany

[22] Filed: Oct. 31, 1974

[21] Appl. No.: 519,679

[30] Foreign Application Priority Data

Nov. 2, 1973    Germany .......................... 2355005

[52] U.S. Cl. .................... 148/6.11; 29/599; 148/127; 148/133; 427/62; 427/380; 427/383 D; 427/436

[51] Int. Cl.² ................. C23C 1/00; C21D 1/00; C22F 1/18

[58] Field of Search ............... 148/6.11, 31.5, 34, 148/127, 133; 29/194, 599; 427/62, 380, 383, 436, 431; 338/325; 335/216

[56] References Cited

UNITED STATES PATENTS

| 3,346,467 | 10/1967 | Allen | 29/599 |
|---|---|---|---|
| 3,884,683 | 5/1975 | Kawobe et al. | 75/174 |

FOREIGN PATENTS OR APPLICATIONS 2,136,868    12/1972    France ............................. 148/133

OTHER PUBLICATIONS

Zeitschrift Fuer Naturforschung 26(b) 1971, pp. 1035–1039.

*Primary Examiner*—C. Lovell
*Attorney, Agent, or Firm*—Kenyon & Kenyon Reilly Carr & Chapin

[57] ABSTRACT

The invention concerns a method for the manufacture of a superconductor with a layer of the A-15 phase of the system Nb-Al-Si. According to the invention, a niobium carrier is provided with a layer about 0.5 to 5 $\mu$m thick consisting of $Nb_3(Al,Si)$, aluminum and silicon by placing it in an aluminum melt which contains up to 10 atomic percent of silicon and a small amount of niobium and is heated to 850° to 1300° C, and then the niobium carrier provided with this layer is annealed in an inert atmosphere for at least 0.5 seconds to form the layer of the A-15 phase.

7 Claims, 3 Drawing Figures

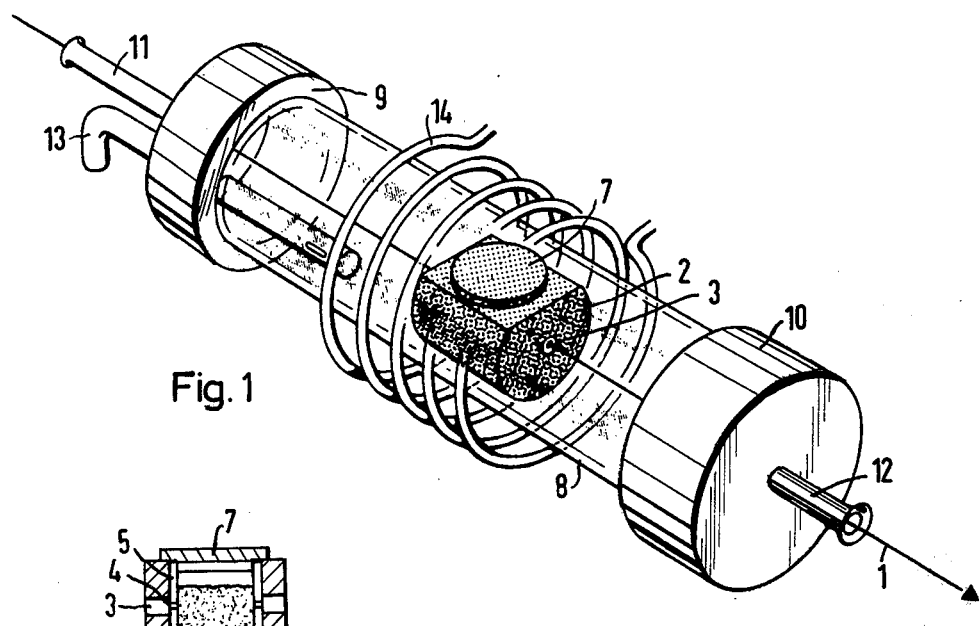
Fig. 1
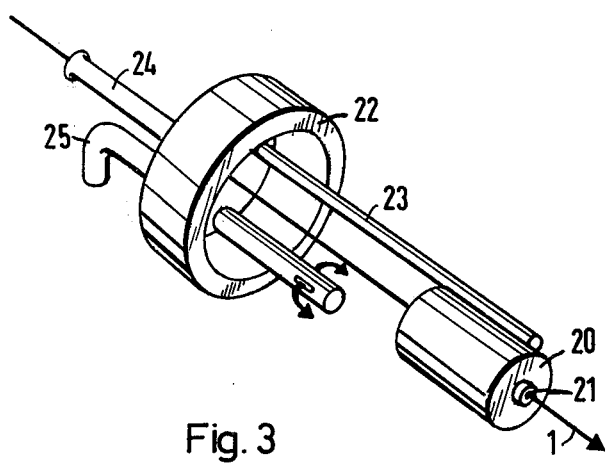
Fig. 2
Fig. 3

METHOD OF THE MANUFACTURE OF A SUPERCONDUCTOR WITH A LAYER OF THE A-15 PHASE OF THE SYSTEM NB-AL-SI

BACKGROUND OF THE INVENTION

1. Field of the Invention

The invention concerns a method for the manufacture of a superconductor with a layer of the A-15 phase of the system Nb-Al-Si.

2. Description of the Prior Art

The A-15 phase of the system Nb-Al-Si, which has a composition of approximately $Nb_3(Al_{1-x}Si_x)$ with $0 < x < 0.3$, becomes superconducting at relatively high temperatures and changes from this state only in very strong magnetic fields. In a single-phase sample of the composition $Nb_{75.3}Al_{21.5}Si_{3.2}$ which was obtained by melting the elements, for instance, a critical (transition) temperature of 19.2° K was measured (see Zeitschrift fuer Naturforschung 26b, (1971), pages 1035 to 1039). The A-15 phase mentioned is therefore of great technical interest, for instance, for use in superconducting magnet coils. However, the technical application of this A-15 phase has so far been unsuccessful because no simple and economical method for manufacturing, in particular, wire-or ribbon-shaped conductors with a layer of this A-15 phase is known. A conductor with a layer of the A-15 phase is desirable, however, because the A-15 phase is very brittle and can be deformed elastically only to slight degree. In technically usable superconductors, the A-15 layer must therefore be only a few $\mu m$ thick and should be situated as closely as possible to the neutral fiber of the conductor.

It is an object of the invention to make possible, as simple as possible, the manufacture of superconductors with a layer of the A-15 phase of the system Nb-Al-Si, while at the same time achieving the highest possible transition temperatures and critical current densities usable for technical applications. In particular, continuous manufacture of long wires or ribbons with thin layers of the A-15 phase mentioned should be possible.

SUMMARY OF THE INVENTION

According to the invention, this problem is solved by providing a niobium carrier with a layer 0.5 to 5 $\mu m$ thick consisting of $Nb(Al,Si)_3$, aluminum, and silicon by placing it in an aluminum melt which consists of up to 10 atomic percent od silicon and small amounts of niobium and is heated to 850° to 1300° C, and by then annealing the niobium carrier provided with this layer in an enert atmsophere for at least 0.5 seconds, to form the layer of the A-15 phase.

The method according to the invention therefore consists essentially of two steps, namely, first the generation of a highly adhering layer, containing niobium, aluminum, and silicon on the surface of the niobium carrier placed in an aluminum melt which contains niobium and silicon and is heated to 850° to 1300° C, and secondly, the formation of the A-15 phase of the system Nb-Al-Si through an annealing treatment of the coated niobium carrier. It is particularly advantageous to perform the annealing for at least 0.5 seconds at a temperature of 1800° to 1950° C for the formation of the A-15 phase of the coated carrier.

BRIEF DESCRIPTION OF THE DRAWINGS

FIG. 1 shows a device to carry out the process in which a wire shaped niobium carrier is immersed in a melt.

FIG. 2 shows a melting crucible used in the device shown in FIG. 1.

FIG. 3 shows a subsection of the device of FIG. 1 wherein the annealing step of the process is carried out.

DESCRIPTION OF THE INVENTION

For the first process step the composition of the aluminum melt is important. If the bath contains more than 10 atomic percent of silicon, then undesired, silicon-rich phases grow at the niobium carrier. For the later preparation of the A-15 phase it is particularly desirable that the niobium carrier is coated in the bath with a layer, in which the atomic ratio of aluminum to silicon is in the range of 24:1 to 22: 3. Layers of this composition are obtained by using melts which contain aluminum and 10 atomic percent of silicon or less and small amounts of niobium. The optimum composition of the melt varies here somewhat with the temperature of the bath.

The niobium carrier to be coated is preferably placed in a melt, heated to about 950° C, of the composition $Al_{95}Si_4Nb_1$. Although this melt is saturated with neither of the three elements aluminum, silicon or niobium, it is nevertheless possible to coat even very long carriers uniformly in such a melt. The melt and the layer produced have here practically the same ratio of aluminum to silicon. At the temperature of 950° C niobium of the carrier goes in solution only in a negligible amount in the form of $Nb(Al,Si)_3$. Without niobium in the melt, however, more niobium would go in solution.

It has been found to be particularly advantageous to immerse the niobium carrier to be coated for about 0.1 to 5 seconds in the above-mentioned melt of the composition $Al_{95}Si_4Nb_1$, heated to 950° C. During this dwelling time of the carrier in the melt, layers with a thickness of about 0.5 to 5 $\mu m$ are formed, which are well suited as the starting layers for the preparation of thin layers of the A-15 phase in the subsequent annealing treatment.

In the following Table, the dependence of the average effective aluminum-silicon layer thickness obtained, $\bar{d}$ Al,Si on the reaction time $t$ is given for coating a niobium layer in a melt of the composition $Al_{95}Si_4Nb_1$, heated to 950° C

| t | (sec) | 0.26 | 0.32 | 0.40 | 0.87 | 2.0 |
|---|---|---|---|---|---|---|
| $\bar{d}_{Al,Si}$ | ($\mu m$) | 0.9 | 1.1 | 1.2 | 1.5 | 2.2 |

"Average effective aluminum-silicon layer thickness" is understood here to be the calculated thickness of a layer consisting only of aluminum and silicon, which corresponds to the aluminum-silicon content of the actually grown layer of $Nb(Al,Si)_3$, aluminum and silicon.

The annealing that follows the coating must be performed, in the method according to the invention, in an inert atmosphere, as already mentioned. As an inert atmosphere is to be understood here a non oxidizing and non nitriding atmosphere, e.g., a vacuum or preferably, a rare gas such as argon. In the temperature range which is provided for the annealing temperature and which is preferably between 1800° and 1950° C, the layer applied to the niobium carrier in the first process step melts completely. The melted film produced then absorbs niobium from the carrier. Subsequently, the A-15 phase is then formed, which contains more niobium than the layer initially applied in the melt.

The transition temperature and the critical current density of the layer of A-15 phase formed in the annealing can be increased still further if the coated and annealed niobium carrier is further heat-treated for at least 10 hours at a temperature of between 500° and 1000° C in an inert atmosphere, preferable in a rare gas.

As already mentioned, the advantages of the method according to the invention show themselves particularly in the manufacture of long, wire-or ribbon shaped niobium carriers with a surface layer of the A-15 phase.

FIGS. 1 to 3 show the parts of a device particularly suited for this purpose. FIG. 1 shows that part of the device, in which the wire-shaped niobium carrier is immersed in the aluminum melt, which contains up to 10 atomic percent of silicon and a small amount of niobium, and is provided with the layer consisting of $Nb(Al,Si)_3$, aluminum and silicon. In FIG. 2 the melting crucible used in the device according to FIG. 1 is shown in further detail in cross section. FIG. 3 shows that subsection of the device, in which the niobium carrier, provided with the mentioned layer, is annealed to form the layer of the A-15 phase.

For the purpose of coating by means of the device shown in FIGS. 1 and 2, the wire- or ribbon-shaped niobium carrier 1 is pulled continuously through an aluminum melt 6 containing silicon and niobium. The melt 6 may be contained, for instance, in a melting crucible 5 provided with passage openings 4 for the niobium carrier 1, consisting, for instance of highly temperature-resistant ceramic, which is enclosed by a metal container 2, for instance, of molybdenum, which is likewise provided with passage openings 3. The lid 7 is provided to close the metal container 2 after the material to be melted is put in place. The metal container 2 with the material to be melted is placed in a tube 8, e.g., a quartz tube, which can be closed off at both ends by caps 9 and 10, which may consist, for instance, of brass and can be cooled, for instance, with water. The caps 9 and 10 are provided with tubular feedthroughs 11 and 12 for the niobium carrier 1. Through a nipple 13 set into the cap 9, the interior of the tube 8 can be supplied with inert gas, e.g., argon. On the out side, the tube 8 is enclosed by a high-frequency heating coil 14, which serves to heat the metal container 2 to the temperature required for the melt.

For the subsequent annealing of the coated niobium carrier 1 is suited, as shown in FIG. 3, a metal element 20, consisting, for instance, of niobium, which is provided with a tubular insert 21 of highly temperature-resistant ceramic, through which the coated niobium carrier 1 is pulled for the annealing. The metal element 20 is attached to a brass cap 22 by means of a metal rod 23. The brass cap 22 is further provided with a tubular feedthrough 24 for the niobium carrier 1 and with a nipple 25. The complete annealing apparatus is obtained if in the device shown in FIG. 1 the metal element 20 with the cap 22 is placed in or on the tube 8 in place of the cap 9 and the metal container 2. The tube 8 can then again be supplied with inert gas, preferably argon, by means of the nipple 25. As in FIG. 1, a high-frequency heating coil 14 again serves to heat the metal element 20 to the required annealing temperature.

The invention will be explained in detail with the aid of an embodiment.

A niobium wire about 120 m long with a diameter of 0.2 mm is pulled through a melt of the composition $Al_{95}Si_4Nb_1$ heated to 950° C, the dwelling time of the wire in the melt being about 0.9 seconds. In this process, layers of $Nb(Al,Si)_3$, aluminum, and silicon are produced on the wire core. The total content of aluminum and silicon of the layers produced corresponds to an aluminum-silicon layer with an average effective layer thickness of 1.5 $\mu$m. Subsequent to the coating, wire is annealed for about 1.6 sec in argon at 1880° C. During the annealing, a sheath about 2.8 $\mu$m thick of the A-15 phase of the system Nb-Al-Si is produced on the wire. This layer has a transition temperature of about 17° K and, in an external magnetic field of 5 Tesla directed perpendicularly to the wire, and at a temperature of 4.2° K, has a critical current density of about $0.7 \times 10^4$ amps/cm$^2$. Through a subsequent heat treatment at about 700° C for about 200 hours in argon, the transition temperature is increased to about 18.6° K and the critical current density is increased at 5 Tesla to about $1.2 \times 10^4$ amps/cm$^2$.

What is claimed is:

1. In a method for manufacturing a superconductor with a layer of the A-15 phase of the system Nb-Al-Si in which a niobium carrier is placed into an aluminum silicon melt at an elevated temperature and is then subjected to annealing in an inert atmosphere, the improvement comprising coating the niobium carrier with a layer having a thickness of approximately 0.5 to 5$\mu$m by steps comprising:
    a. preparing a melt having the composition $AL_{9.5}Si_4Nb_1$;
    b. heating said melt to a temperature between 850° and 1300° C;
    c. passing said niobium carrier through said melt and thereafter;
    d. annealing said carrier with a deposited layer of said melt at a temperature between 1800° and 1950° C for at least 0.5 seconds.

2. The method of claim 1 wherein said melt is heated to a temperature of about 950° C.

3. The method of claim 2 wherein the placing of said niobium carrier in said aluminum melt step yields on said carrier a deposited layer in which the atomic ratio of aluminum to silicon is 24:1 to 22:3.

4. The method of claim 2 wherein the placing of said niobium carrier in said aluminum melt step lasts for 0.1 to 5 seconds.

5. The method of claim 2 further comprising the step of
    further heat-treating the coated and annealed niobium carrier for at least 10 hours at a temperature of between 500° and 1000° C.

6. The method of claim 2 wherein the placing of said niobium carrier in said aluminum melt step lasts for 0.1 to 5 seconds.

7. The method of claim 4 further comprising the step of
    further heat-treating the coated and annealed niobium carrier for at least 10 hours at a temperature of between 500° and 1000° C.

* * * * *